(12) United States Patent
Kagami et al.

(10) Patent No.: US 7,548,400 B2
(45) Date of Patent: Jun. 16, 2009

(54) THIN-FILM MAGNETIC HEAD COMPRISING BIAS LAYERS HAVING A LARGE LENGTH IN TRACK WIDTH DIRECTION

(75) Inventors: Takeo Kagami, Tokyo (JP); Noriaki Kasahara, Tokyo (JP); Kazuki Sato, Tokyo (JP); Takayasu Kanaya, Tokyo (JP)

(73) Assignee: TDK Corporation, Chuo-ku, Tokyo (JP)

( * ) Notice: Subject to any disclaimer, the term of this patent is extended or adjusted under 35 U.S.C. 154(b) by 399 days.

(21) Appl. No.: 11/066,763

(22) Filed: Feb. 28, 2005

(65) Prior Publication Data

US 2005/0195536 A1  Sep. 8, 2005

(30) Foreign Application Priority Data

Mar. 2, 2004  (JP) .............................. 2004-057525

(51) Int. Cl.
G11B 5/33 (2006.01)
(52) U.S. Cl. ................................. 360/324.12
(58) Field of Classification Search .............. 360/324.1, 360/324.11, 324.12, 324.2, 322; 29/603.14
See application file for complete search history.

(56) References Cited

U.S. PATENT DOCUMENTS 5,739,990 A * 4/1998 Ravipati et al. ......... 360/324.12
5,847,904 A * 12/1998 Bharthulwar ............... 360/322

(Continued)

FOREIGN PATENT DOCUMENTS

JP  6-60326  3/1994

(Continued)

OTHER PUBLICATIONS

Japanese Office Action dated Aug. 16, 2006.

Primary Examiner—Angel A. Castro
(74) Attorney, Agent, or Firm—McGinn IP Law Group, PLLC

(57) ABSTRACT

The thin-film magnetic head of the present invention comprises an MR sensor wherein a first ferromagnetic layer in which a magnetization direction is fixed with respect to external magnetic fields, a non-magnetic intermediate layer, and a second ferromagnetic layer in which a magnetization direction changes with respect to the external magnetic fields are stacked, and wherein a sense current flows substantially parallel to the stacked layer surface. The thin-film magnetic head comprises a pair of bias layers for exerting a bias magnetic field upon the MR sensor; the bias layers extending substantially symmetrically from two sides of the MR sensor in a direction of track width of a recording medium, each bias layer being connected with the MR sensor over a length which is substantially the same as the MR sensor in a direction perpendicular to the air bearing surface; and each bias layer having a shape which is contained within an imaginary rectangle which has its long sides along the air bearing surface in the direction of the track width of the recording medium and its short sides in the direction perpendicular to the air bearing surface and which contacts the short side of the imaginary rectangle which is opposite the short side which contacts the MR sensor. The thin-film magnetic head further comprises a pair of lead layers for supplying the sense current to the MR sensor each extending from the air bearing surface to cover at least a portion of each of the bias layers.

4 Claims, 13 Drawing Sheets

U.S. PATENT DOCUMENTS

| | | | |
|---|---|---|---|
| 6,061,211 A * | 5/2000 | Yoda et al. | 360/324.12 |
| 6,545,848 B1 * | 4/2003 | Terunuma | 360/324.12 |
| 6,606,216 B1 * | 8/2003 | Liikanen et al. | 360/77.08 |
| 6,665,153 B1 * | 12/2003 | Hayashi | 360/322 |
| 7,019,948 B2 * | 3/2006 | Shoji | 360/322 |
| 7,229,706 B2 * | 6/2007 | Hasegawa et al. | 428/811.5 |
| 7,241,514 B2 * | 7/2007 | Kagami et al. | 428/811.1 |
| 2002/0012209 A1 | 1/2002 | Ajiki et al. | |
| 2006/0067010 A1 * | 3/2006 | Kagami et al. | 360/324.1 |

FOREIGN PATENT DOCUMENTS

| | | | |
|---|---|---|---|
| JP | 9-128712 | | 5/1997 |
| JP | 10-335714 | | 12/1998 |
| JP | 2000-132815 | | 5/2000 |
| JP | 2000200404 | * | 7/2000 |
| JP | 2001043512 | * | 2/2001 |
| JP | 2001-351208 | | 12/2001 |
| JP | 2002-353538 | | 12/2002 |
| JP | 2003-99905 | | 4/2003 |

* cited by examiner

THIN-FILM MAGNETIC HEAD COMPRISING BIAS LAYERS HAVING A LARGE LENGTH IN TRACK WIDTH DIRECTION

BACKGROUND OF THE INVENTION

1. Field of the Invention

The present invention relates to a thin-film magnetic head for reading and writing signals as magnetic field intensity of a magnetic recording medium, and more particularly to the structure of and the method for fabricating a thin-film magnetic head of CIP configuration, and further, to a thin-film magnetic head wafer, and to a head gimbal assembly and a hard disk device which utilize the thin-film magnetic head.

2. Description of the Related Art

The progression of hard disk drives to ever-greater magnetic recording density has reached a level in which the mass production of devices in the 100-Gbpsi class is now being targeted. In response to this progression to higher densities, magnetic heads which employ a GMR (Giant Magnetoresistive) sensor are being used as reproduction elements. In particular, GMR sensors which use spin-valve (SV) films exhibits great change in resistance to the sense current which flows in the sensor for reading the record of a recording medium and can provide a magnetic head of higher sensitivity. An SV film is a laminated film which is formed by sandwiching a non-magnetic intermediate layer between a ferromagnetic layer in which the direction of magnetization is fixed in one direction (hereinbelow, also referred to as a "pinned layer") and a ferromagnetic layer in which the direction of magnetization changes according to the external magnetic field generated by the recording medium (hereinbelow, also referred to as a "free layer"). In an SV film, the direction of magnetization of the free layer forms a relative angle with respect to the direction of magnetization of the pinned layer according to the external magnetic field, and the spin-dependent scattering of conduction electrons changes according to this relative angle, thereby giving rise to change in magneto-resistance. A magnetic head detects this change in magneto-resistance to read the magnetic information of the recording medium.

The mainstream of read sensors has been a CIP (Current In Plane)-GMR sensor, in which a sense current flows parallel to the layer surfaces. Although there is a recent push for the development of CPP (Current Perpendicular to the Plane)-GMR sensors in which the sense current flows perpendicular to the layer surfaces and TMR sensors which employ TMR (Tunnel Magneto-Resistance) films to cope with even higher recording densities, the importance of CIP-GMR sensors remains unchanged.

FIG. 1 shows a partial perspective view of a read head portion of a conventional thin-film magnetic head. Thin-film magnetic head 101 may be a head dedicated for reading, or may be an MR/inductive composite head which further includes a write head portion. MR sensor 102 is sandwiched between lower magnetic shield 103 and upper magnetic shield 109 with its end portion arranged at a position which confronts recording medium D. Lower insulating layer 104 is further provided between MR sensor 102 and lower magnetic shield 103, and upper insulating layer 108 is provided between MR sensor 102 and upper magnetic shield 109 (in contrast to FIG. 1, MR sensor 102 and upper insulating layer 108 are actually in contact). The surface which confronts recording medium D will hereinbelow also be referred to as air bearing surface ABS. Lateral layers 105a and 105b are provided on the sides of MR sensor 102, and as shown by the solid black arrow in FIG. 1, sense current 122 flows parallel to the surface of stack of MR sensor 102. The magnetic field of recording medium D at the position confronting MR sensor 102 changes with the movement in the direction T of recording medium D which is shown by the white arrow in FIG. 1. MR sensor 102 is able to read the magnetic information which is written to each magnetic domain of recording medium D by detecting this change in the magnetic field as the change in electrical resistance of sense current 122 which is obtained by the GMR effect.

FIG. 2 shows a sectional view taken along the line A-A in FIG. 1, i.e., seen from air bearing surface ABS of MR sensor 102. MR sensor 102 is formed by laminating lower ferromagnetic layer 121, non-magnetic layer 122, and upper ferromagnetic layer 123 in that order, and lateral layers 105a and 105b are provided on both sides of these layers. Upper insulating layer 108 and upper magnetic shield 109 are then laminated in that order over these layers.

Lateral layers 105a and 105b are each composed of bias layer 106 and lead layer 107. Bias layer 106 is composed of a soft magnetic layer and an antiferromagnetic layer (not shown). Lead layer 107 functions as an electrode for the flow of sense current 122. A protective layer (not shown) may in some cases be provided over this layer. Bias layer 106 exerts a bias magnetic field upon MR sensor 102. Bias layer 106 will be described in further detail hereinbelow.

In general, it is desirable for MR sensors such as CIP-GMR sensors to exhibit linear characteristics of change in resistance in response to change in the external magnetic field. For that purpose, detection of an external magnetic field is carried out while a bias magnetic field is applied to an MR sensor. In MR sensors of the prior art, a hard magnetic layer has been used as the magnetic material which produces the bias magnetic field. However, the trend toward higher recording densities of the recording medium has been requiring write elements and MR sensors which can cope with narrower tracks. In the 100-Gbpsi class device which is close to mass production, the width of the free layer must be reduced to the order of 100 nm, a reduction which requires a major advance in microprocessing technology. However, there are limits to microprocessing technology, and microprocessing of this order may lead to a degradation of yield. Given these circumstances, it has been found that the use of an exchange bias layer in which the hard magnetic layer is replaced by a laminate of a soft magnetic layer and an antiferromagnetic layer enables a reduction of the effective track width for reading for the same free layer width, and is thus effective for achieving higher recording densities. Although the mechanism for this effect is not clear enough, it is believed that a form of side-shield effect is brought into play due to the use of the soft magnetic layer. The term "bias layer" in the present specification refers to an exchange bias layer.

Bias layer 106 and lead layer 107 have substantially identical planar shape and are laminated with bias layer 106 below and lead layer 107 above, and as shown by lateral layers 105a and 105b in FIG. 1, are formed to a deep position from air bearing surface ABS. In the present specification, the word "deep" is used with regard to the distance in the direction perpendicular to air bearing surface ABS. The same holds true for "height." Bias layer 106 and lead layer 107 are formed to a deep position for reasons for the fabrication process and for the purpose of suppressing the series resistance of lead layer 107. In other words, to produce an MR sensor according to the prior art, lower ferromagnetic layer 121, non-magnetic layer 122, and upper ferromagnetic layer 123 are laminated in that order over the entire surface of the substrate, following which portions of these layers are replaced by a pair of bias layers 106 and lead layers 107 which are separated by track width TW. A resist is then formed, and the rear portions (as seen from air bearing surface ABS) of lower ferromagnetic layer 121, non-magnetic layer 122, and upper ferromagnetic layer 123 are removed to form MR sensor 102 of a prescribed MR height. At this stage, if lead layer 107 is not sufficiently thick or if a protective layer of sufficient thickness is not present on lead layer 107, the upper portion of lead layer 107 is removed in the vicinity of MR sensor 102. This removal results in an increase in the series resistance of lead layer 107 to the sense current, preventing increase in sensitivity. Therefore, lead layer 107 is made sufficiently thick or a protective layer of sufficient thickness is formed on lead layer 107 simultaneously with bias layer 106 and lead layer 107. In such a configuration, lead layer 107 is protected and not reduced unnecessarily in the vicinity of MR sensor 102, and a sufficient cross-sectional area is ensured. As a result, the simultaneously formed bias layer is also formed to the same deep position in substantially the same "U" form as the lead layer 107.

However, an MR sensor which employs exchange bias layers suffers from the following problems. Various measurements are made in the fabrication steps of a thin-film magnetic head to check performance, one of these tests being the Quasi-Static Test (QST). This test is performed by simulating the actual environment of use as a hard disk device before final assembly. More specifically, a uniform magnetic field which is generated by a magnetic field generating means is applied from the outside in place of the magnetic field of a recording medium to measure and appraise the various characteristics of a magnetic head which is in the process of fabrication.

However, the magnetic field applied in this test, which is in the range of several ten thousands of A/m (several 100 Oe), is significantly greater than the magnetic field exerted upon the product in an actual environment. The exchange bias layer is more prone to fluctuation with respect to the external magnetic field than a hard magnetic layer, and when subjected to such a strong magnetic field, the direction of magnetization of the layer is partially disrupted, whereby the exchange bias layer is unable to properly exert a bias magnetic field upon the MR sensor, and the effective track width is consequently enlarged (degraded).

This point is next explained in greater detail. A measurement method known as the microtrack profiling method is used to appraise the effective track width. In the microtrack profiling method, the head is off-tracked (shifted in the direction of track width) with respect to the written track to erase either both sides or one side of the track and thereby form a track width having approximately $\frac{1}{5}$-$\frac{1}{10}$ of the written track width. The read head is then off-tracked on this narrow track and the change in the reproduction output is measured. The reproduction output normally assumes a bell-shaped form which takes the track center as its apex when the amount of off-tracking is taken on the transverse axis and the reproduction output is taken on the vertical axis, as shown in FIG. 3A. The amount of off-tracking which corresponds to the half-width of this reproduction output is taken as the effective track width.

However, when subjected to a large magnetic field by, for example, QST, the peak not only diverges from the track center, but maximum points also emerges at positions other than the peak, as shown in FIG. 3B. In addition, exposure to external magnetic fields occur in various situations other than QST. These maximum points are referred to as side lobes, and side lobes tend to degrade the resolution in the direction of track width, to increase the effective track width, and consequently, to interfere with higher recording densities.

Forming bias layers in the narrowest possible rectangular shape is believed to be effective for suppressing the occurrence of side lobes. This effect is believed to occur probably because the shape anisotropy of the bias layer stabilizes the bias layer against strong magnetic fields in the direction of depth, and particularly against magnetic fields caused by QST. A number of bias layers having such long and narrow shapes have been disclosed (for example, refer to the specification of Japanese Patent Laid-Open Publication No. 2001-351208).

In the prior art, however, if the lead layer is formed to a deep position to suppress the series resistance of the lead layer, the bias layer is also formed to a deep position, and the suppression of side lobes which results from forming a long and narrow bias layer therefore cannot be expected. On the other hand, when the bias layer is formed in a long and narrow shape to solve the problem of side lobes, the lead layer is reduced in the vicinity of the MR sensor, and this configuration increases the series resistance to the sense current.

Thus, in the prior art, a technique which is capable of satisfying the contradictory demands of suppressing the occurrence of side lobes and suppressing the series resistance of the lead layer has not yet been disclosed. However, these contradictory demands must be satisfied to achieve higher recording densities in the future.

SUMMARY OF THE INVENTION

An object of the present invention is to provide a thin-film magnetic head employing a CIP MR sensor which is capable of suppressing both the occurrence of side lobes and the increase of series resistance in the lead layers, whereby achieving a higher recording densities. Another object of the present invention is to provide a method of fabricating the thin-film magnetic head above described. Yet another object of the present invention is to provide a head gimbal assembly and hard disk device which use this thin-film magnetic head.

The thin-film magnetic head of the present invention comprises an MR sensor wherein a first ferromagnetic layer in which a magnetization direction is fixed with respect to external magnetic fields, a non-magnetic intermediate layer, and a second ferromagnetic layer in which a magnetization direction changes with respect to the external magnetic fields are stacked, and wherein a sense current flows substantially parallel to the stacked layer surface. The thin-film magnetic head comprises a pair of bias layers for exerting a bias magnetic field upon the MR sensor; the bias layers extending substantially symmetrically from two sides of the MR sensor in a direction of track width of a recording medium, each bias layer being connected with the MR sensor over a length which is substantially the same as the MR sensor in a direction perpendicular to the air bearing surface; and each bias layer having a shape which is contained within an imaginary rectangle which has its long sides along the air bearing surface in the direction of the track width of the recording medium and its short sides in the direction perpendicular to the air bearing surface and which contacts the short side of the imaginary rectangle which is opposite the short side which contacts the MR sensor. The thin-film magnetic head further comprises a pair of lead layers for supplying the sense current to the MR sensor each extending from the air bearing surface to cover at least a portion of each of the bias layers.

In this way, the bias layers is formed in a long and narrow shape which has substantially the same height as the MR sensor and can exert an appropriate bias magnetic field upon the MR sensor by means of the effect of shape anisotropy. On the other hand, the lead layers is formed on the bias layers with sufficient extension to a deep position, thus an undesirable increase in resistance of the lead layers to the sense current can be avoided. These effects enable an improvement in the reproduction characteristics of the thin-film magnetic head.

A method for fabricating a thin-film magnetic head of the present invention comprises the steps of: forming on a wafer at least one center layer which includes in a portion an MR sensor wherein a first ferromagnetic layer in which a magnetization direction is fixed with respect to external magnetic fields, a non-magnetic intermediate layer, and a second ferromagnetic layer in which a magnetization direction changes with respect to the external magnetic fields are stacked and wherein a sense current flows substantially parallel to the stacked layer surface; forming a pair of initial bias layers on both sides of the center layer, wherein each of the initial bias layers includes in a portion a bias layer for exerting a bias magnetic field upon the MR sensor; forming a pair of initial lead layers on both sides of the center layer, wherein each of the initial lead layers extends to cover at least a portion of each of the initial bias layers and contains a lead layer for supplying the sense current to the MR sensor. The method further comprises the step of processing the wafer, the center layer, the initial bias layers, and the initial lead layers and forming the MR sensor by exposing an air bearing surface. In this step, the pair of bias layers are formed such that: the bias layers extend substantially symmetrically from two sides of the MR sensor in a direction of track width of a recording medium; the bias layers are each connected with the MR sensor over a length which is substantially equal to a length of the MR sensor in a direction perpendicular to the air bearing surface, and the bias layers each have a shape which is contained within an imaginary rectangle which has long sides along the air bearing surface in the direction of track width of the recording medium and short sides in the direction perpendicular to the air bearing surface, wherein each bias layer contacts the short side of the imaginary rectangle which is opposite the short side which contacts the MR sensor, and the pair of lead layers are formed such that each of the lead layers extends from the air bearing surface to cover at least a portion of each of the bias layers.

In this way, the bias layers and the lead layers can be produced in separate steps, whereby the bias layers can be produced in a long and narrow shape which, by the effect of shape anisotropy, can exert an appropriate bias magnetic field upon the MR sensor, while the lead layers, in contrast, can be formed on the bias layers with sufficient extension to a deep position, thus an undesirable increase in resistance of the lead layers to the sense current can be avoided. These effects enable the improvement of the reproduction characteristics of the thin-film magnetic head.

In the thin-film magnetic head of the present invention, bias layers are formed in a long and slender shape having substantially the same height as the MR sensor and thus can apply an appropriate bias magnetic field to an MR sensor by means of the effect of shape anisotropy. On the other hand, lead layers are formed on the bias layers with sufficient extension to a deep position, whereby increase in the resistance to the sense current can be avoided. In addition, the method for fabricating a thin-film magnetic head of the present invention enables the reliable and efficient fabrication of a thin-film magnetic head having these characteristics.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 4A:
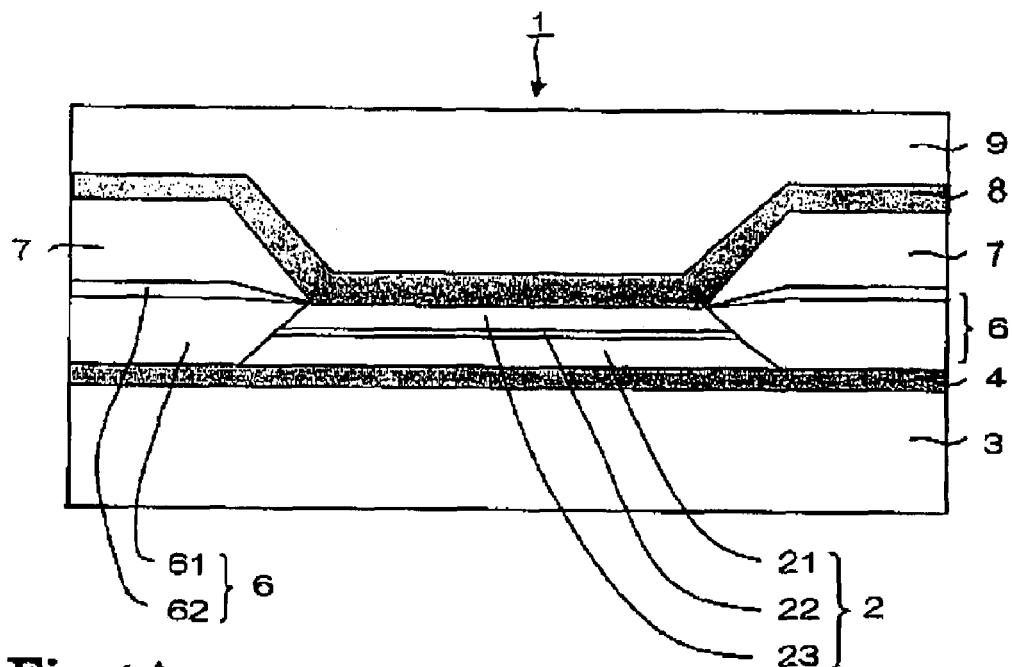
FIG. 4A is a sectional view of the vicinity of a MR sensor of a thin-film magnetic head of the present invention as seen from air bearing surface ABS.

Explanation next regards the details of a thin-film magnetic head and a method for fabricating the thin-film magnetic head according to the present invention with reference to the accompanying drawings. FIG. 4A is a sectional view showing the vicinity of a MR sensor of a thin-film magnetic head of the present invention as seen from an air bearing surface. Thin-film magnetic head 1 may be a head dedicated to reading, or may be a MR/inductive composite head further having a write head portion. MR sensor 2 is formed by stacking lower ferromagnetic layer 21, non-magnetic layer 22, and upper ferromagnetic layer 23 in that order. These layers are formed on a layer in which lower magnetic shield 3 and lower insulating layer 4 are laminated. Bias layers 6 and lead layers 7 are provided on both sides of MR sensor 2. Lower magnetic shield 3 is made of NiFe, and lower insulating layer 4 is made of, for example, $Al_2O_3$.

Lower ferromagnetic layer 21 is a ferromagnetic layer in which the direction of magnetization is fixed in one direction and remains unaffected by the external magnetic field of, for example, a recording medium; and lower ferromagnetic layer 21 is therefore a pinned layer, as previously described. A pinned layer is made of ferromagnetic alloys, for example metals such as iron (Fe), cobalt (Co), or nickel (Ni), as its principal component. A so-called synthetic pinned layer (a pinned layer of laminated structure in which a first pinned layer which is a magnetic layer, a non-magnetic metal layer, and second pinned layer which is a magnetic layer are stacked in that order, the first pinned layer and second pinned layer being antiferromagnetically coupled) may be also used. Copper (Cu) is typically used in non-magnetic layer 22. Upper ferromagnetic layer 23 is a ferromagnetic layer in which the direction of magnetization changes according to the external magnetic field generated from the recording medium; and upper ferromagnetic layer 23 is therefore a free layer, as previously described. A free layer is made of a ferromagnetic alloy, for example alloys such as CoFe or NiFe, as its principal component.

In the present embodiment, each of bias layers 6 is formed by stacking soft magnetic layer 61 and antiferromagnetic layer 62 in that order, but the layers may be stacked in the reverse order. Bias layers 6 exert a bias magnetic field upon MR sensor 2. Materials such as NiFe or CoFe may be used in soft magnetic layer 61, and materials such as IrMn, RuRhMn or PtMn may be used in antiferromagnetic layer 62.

Each of lead layers 7 functions as an electrode through which sense current flows to MR sensor 2. A material such as AuCu is used in lead layers 7. The upper and lower sides of lead layers 7 may be covered by protective layers (not shown) composed of, for example, tantalum (Ta). Lead layers 7, together with MR sensor 2, are covered by upper insulating layer 8 and upper magnetic shield 9. Upper insulating layer 8 is made of $Al_2O_3$, and upper magnetic shield 9 is made of, for example, NiFe.

Figure 4B:
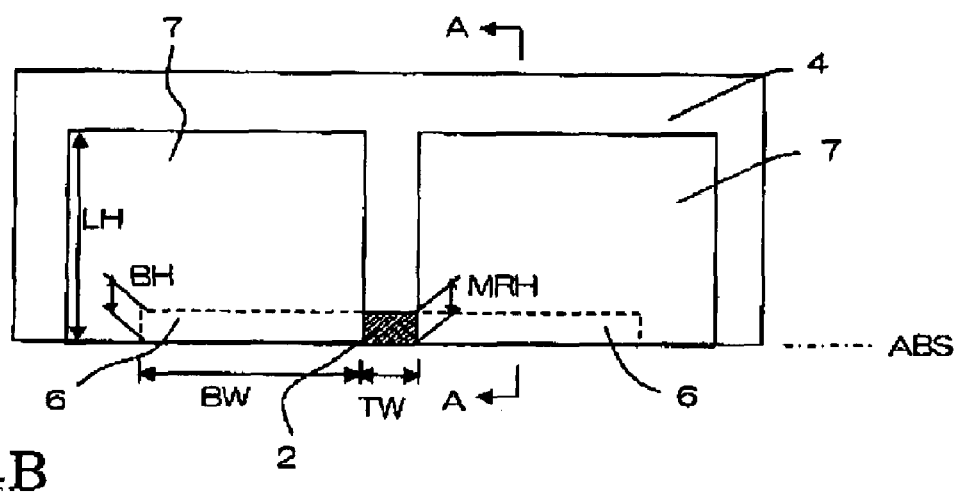
FIG. 4B is a plan view of the vicinity of the MR sensor of the thin-film magnetic head shown in FIG. 4A.

FIG. 4B is a plan view of the vicinity of MR sensor of the thin-film magnetic head. Upper insulating layer 8 and upper magnetic shield 9 are not shown in this figure. MR sensor 2 faces air bearing surface ABS, and its rear surface is formed at a prescribed MR height (also referred to as "MRH" hereinbelow). The width of MR sensor 2 which faces air bearing surface ABS determines track width TW.

Bias layers 6 are a pair of long and narrow rectangles formed substantially symmetrically on both sides of MR sensor 2, facing air bearing surface ABS. Height BH of bias layers 6 is substantially identical to MRH, and width BW which faces air bearing surface ABS is greater than height BH. In order to obtain the effect of shape anisotropy, the ratio of width BW to height BH is preferably at least 5.

The pair of lead layers 7 is formed substantially symmetrically on both sides separated by track width TW. Each layer 7 faces air bearing surface ABS, covers each of the two bias layers 6, and extends toward the rear. In other words, height LH of lead layers 7 is greater than height BH of bias layers 6. Although lead layers 7 do not cover MR sensor 2 in the present embodiment, lead layers 7 may cover a portion of MR sensor 2. In this case, the spacing of lead layers 7 is less than track width TW. Alternatively, the spacing of lead layers 7 may be wider than track width TW.

Figure 5A:
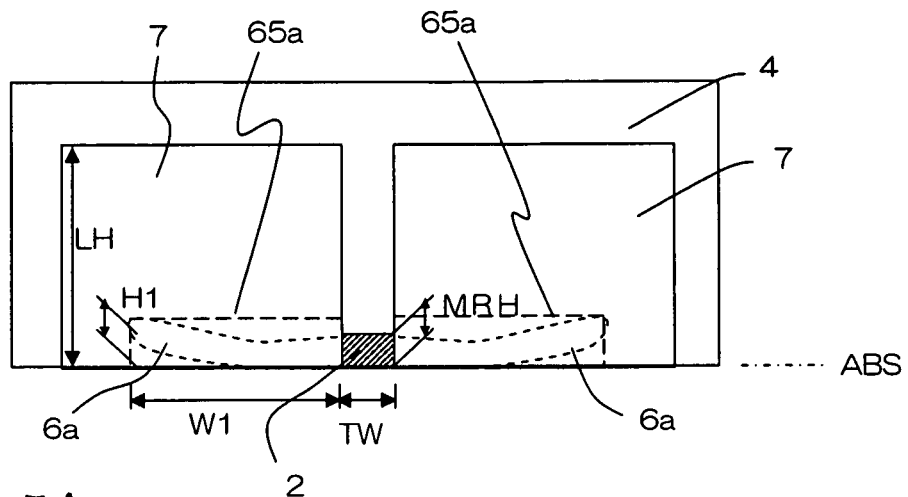
FIGS. 5A-5C are plan views of the vicinity of the MR sensor of the thin-film magnetic head shown in FIG. 4A.
Figure 5B:
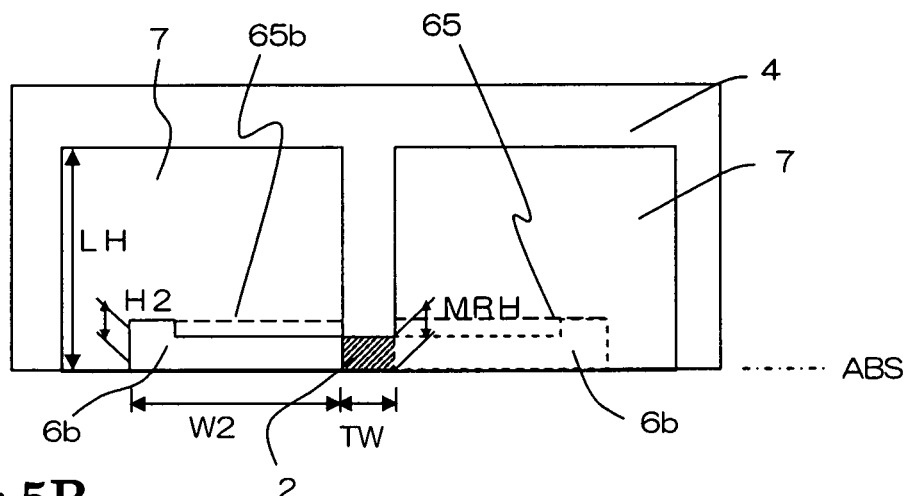
Figure 5C:
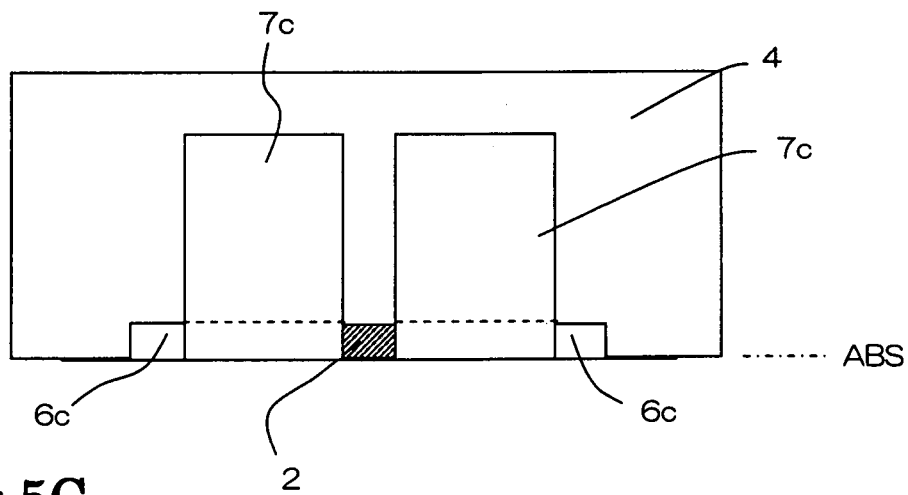

FIGS. 5A-5C are plan views of the vicinity of the MR sensor of the thin-film magnetic head. The shape of bias layers 6 is not limited to the rectangular shape described above, and can adopt more generalized shapes shown in FIGS. 5A-5C. In other words, the shape of bias layers 6 may assume any long and narrow form as long as the effect of shape anisotropy is expected and need not be a strictly rectangular shape. For example, the shape of bias layers 6 may be any shape which is contained within imaginary rectangles 65a and 65b having long sides in the direction of track width and short sides in the direction perpendicular to air bearing surface ABS, such as an overall irregular shape shown in FIG. 5A or a shape which is formed to a deep position at the end of a rectangle shown in FIG. 5B. However, the ratio of the long sides W1 to the short sides H1 of the rectangle (or the ratio of long sides W2 to short sides H2) is preferably at least 5. In addition, lead layers 7 need not cover bias layers 6 entirely. Specifically, lead layers 7c do not cover a portion of bias layers 6c, as shown in FIG. 5C.

Figure 6:
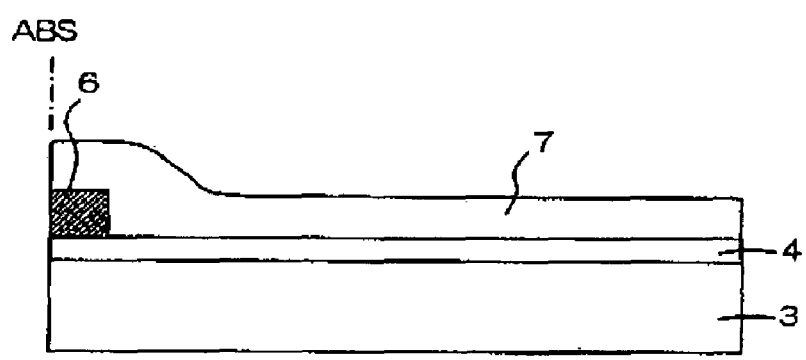
FIG. 6 is a sectional view which shows a bias layer of the thin-film magnetic head shown in FIG. 4A.

FIG. 6 is a sectional view of the thin-film magnetic head showing the bias layer taken from the line A-A in FIG. 4B. As with FIG. 4B, upper insulating layer 8 and upper magnetic shield 9 are not shown. Bias layer 6 is formed only in the vicinity of air bearing surface ABS, and the covering lead layer 7 therefore bulges up only above bias layer 6 and then falls to a lower level.

Explanation next regards the method for fabricating the thin-film magnetic head with reference to FIGS. 7A to 10B.

Figure 7A:
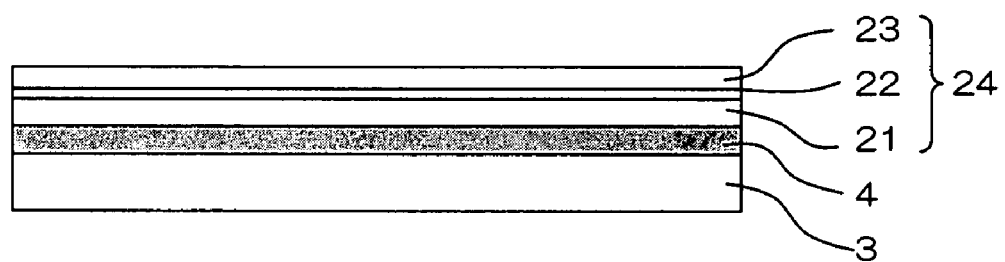
FIG. 7A to FIG. 10B are explanatory views showing a method for fabricating a thin-film magnetic head of the present invention.
Figure 7B:
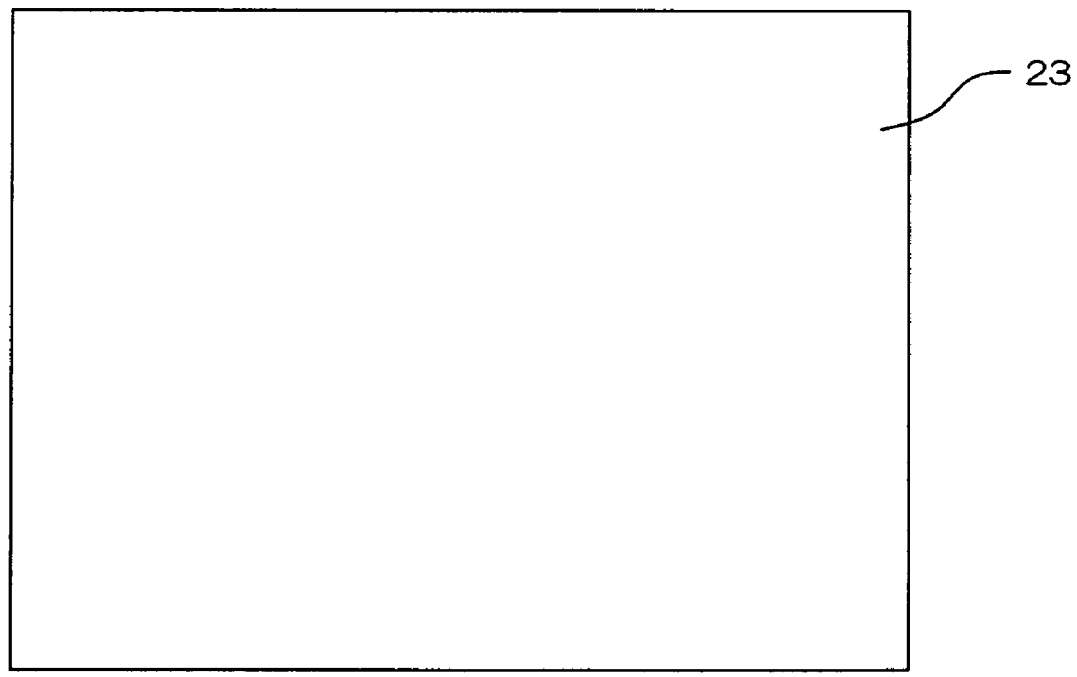

As shown by the sectional view in FIG. 7A, lower magnetic shield 3 and lower insulating layer 4 are stacked on a substrate (not shown) which is composed of, for example, $Al_2O_3 \cdot TiC$ (AlTiC). Lower ferromagnetic layer 21, non-magnetic layer 22, and upper ferromagnetic layer 23 which constitute MR sensor 2 are further stacked in that order to cover lower insulating layer 4. FIG. 7B is a plan view of FIG. 7A, and at this stage, the entire upper surface is covered by upper ferromagnetic layer 23. Lower ferromagnetic layer 21, non-magnetic layer 22, and upper ferromagnetic layer 23 at this stage will together be referred to as center layer 24.

Figure 8A:
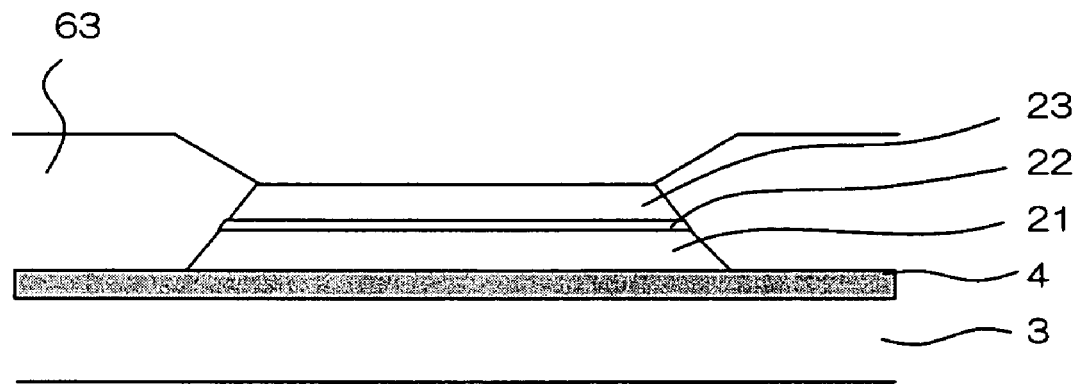
Figure 8B:
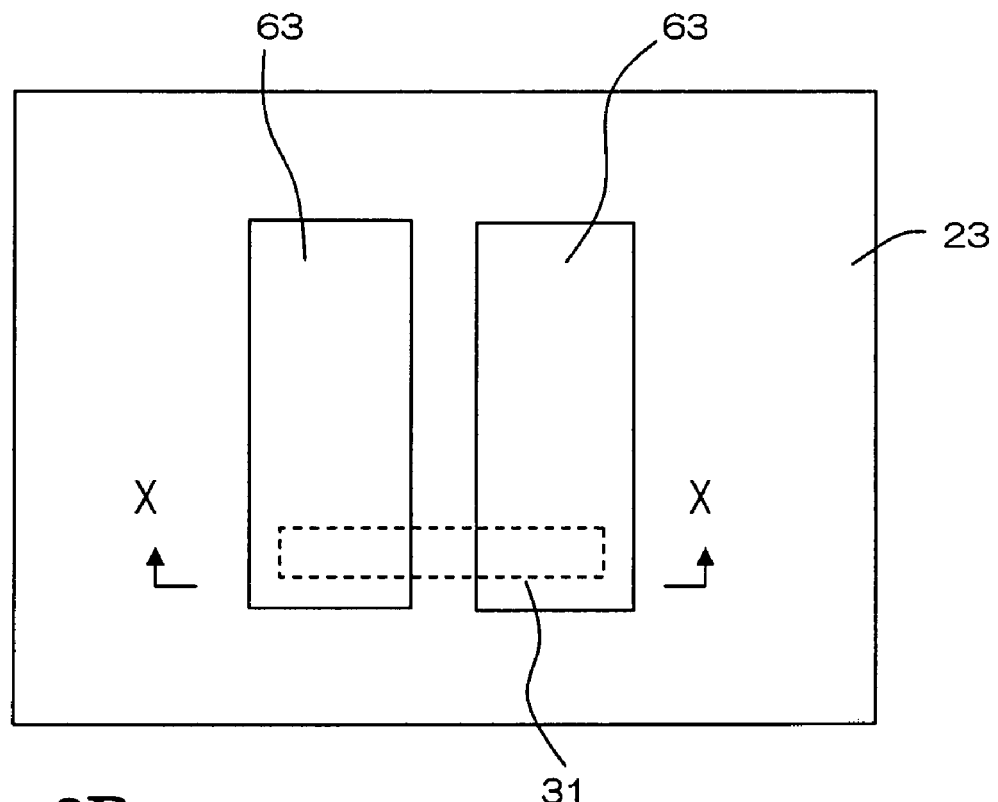

Original bias layers 63 are next formed. FIG. 8B shows a plan view at this stage, and FIG. 8A shows a sectional view taken along the line X-X in FIG. 8B. Portions of center layer 24 depicted as original bias layers 63 in FIG. 8B are subjected to milling to remove part of center layer 24 and replaced by original bias layers 63. The spacing between the two original bias layers 63 is adjusted to equal track width TW. In this way, original bias layers 63 are formed to deep positions on both sides of MR sensor 2, as shown in FIG. 8B. Note that resist layer 31 in FIG. 8B has not been formed at this stage. Although original bias layers 63 are formed slightly higher than upper ferromagnetic layer 23 as shown in FIG. 8A, original bias layers 63 may be formed lower.

Figure 9A:
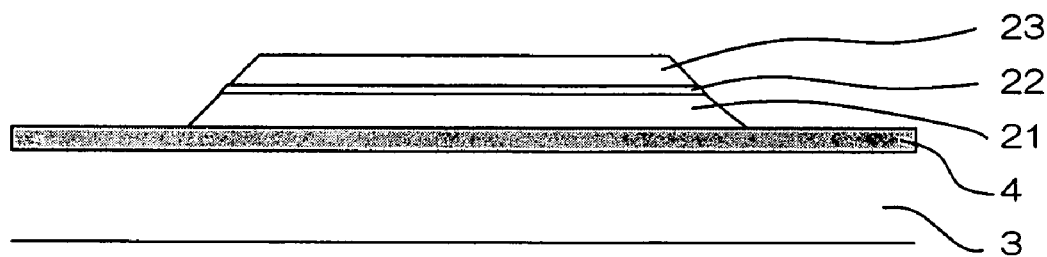
Figure 9B:
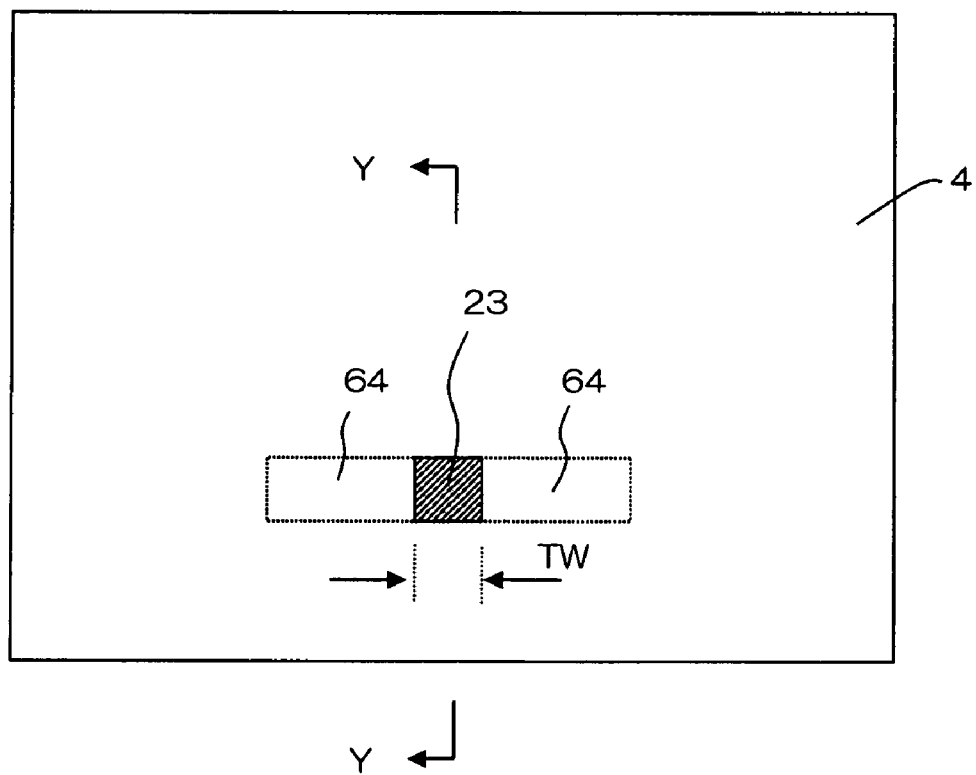

Next, resist 31 is formed in a long and narrow shape as shown in FIG. 8B. Original bias layers 63 and center layer 24 are then removed by milling excepting the portions which are protected by resist layer 31. FIG. 9B shows a plan view at this stage, and FIG. 9A shows a sectional view taken along the line Y-Y in FIG. 9B. As a result of this process, long and narrow initial bias layers 64 are formed on both sides of center layer 24 as shown in FIGS. 9A and 9B.

Figure 10A:
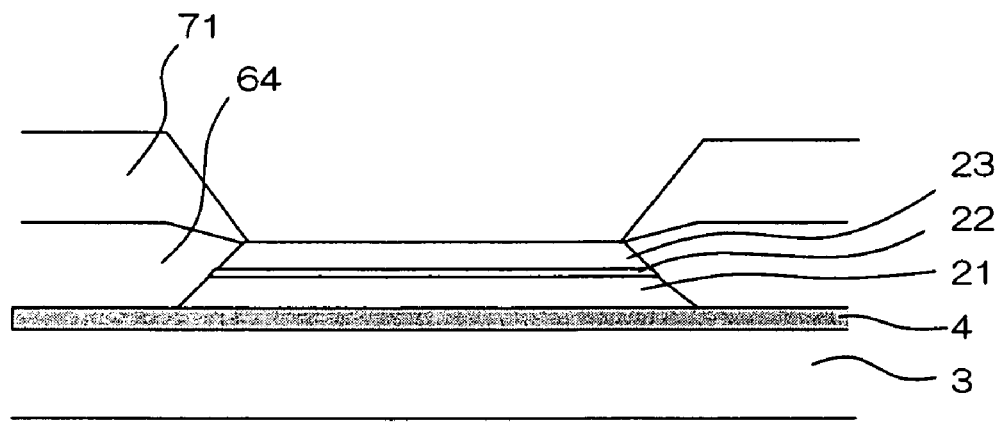
Figure 10B:
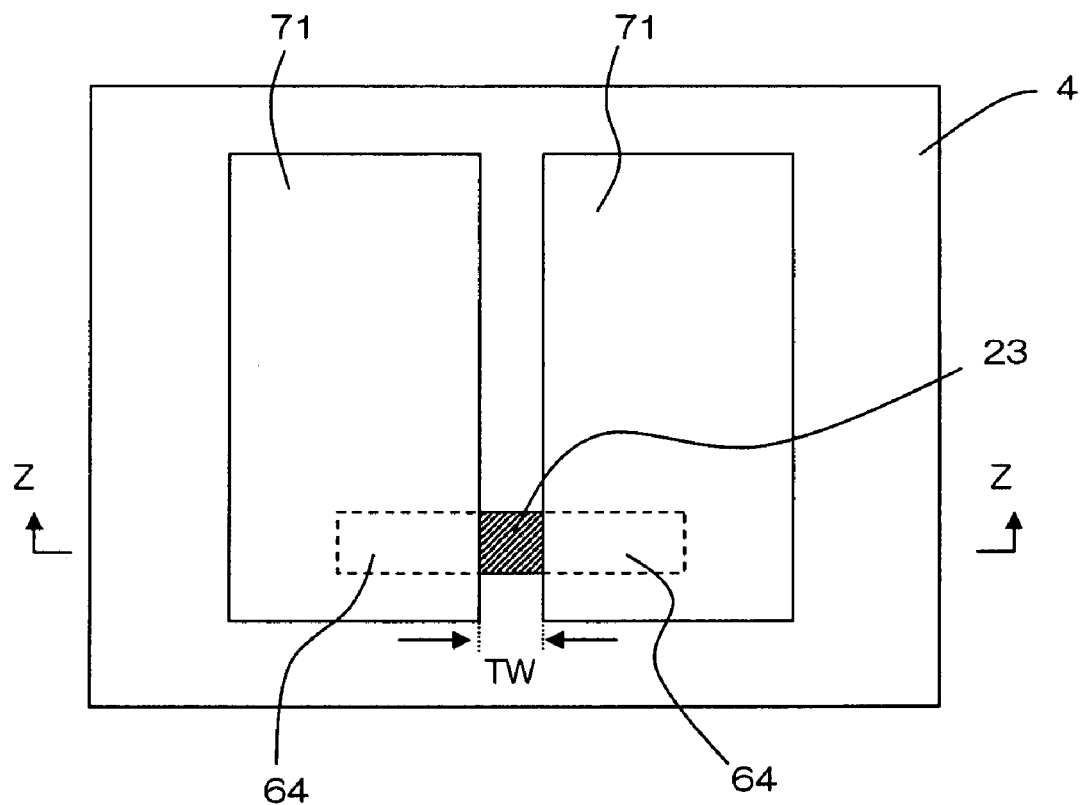

Initial lead layers 71 are next formed to cover initial bias layers 64. In this embodiment, initial lead layers 71 are formed on both sides of center layer 24 at a spacing of track width TW, but as previously described, the spacing may be greater than or less than track width TW, and initial lead layers 72 need not cover the entire initial bias layers 64. FIG. 10B shows a plan view at this stage, and FIG. 10A shows a sectional view take along the line Z-Z in FIG. 10B. As a result of this process, initial lead layers 71 are formed such that they extend over lower insulating layer 4 and cover initial bias layers 64 on both sides of center layer 24, as shown in FIGS. 10A and 10B. This process in which original bias layers 63 and initial bias layers 64 are formed independently of and prior to initial lead layers 71 is a distinguishing feature of the present fabrication method.

Next, upper insulating layer 8 and upper magnetic shield 9 are stacked to complete the layer structure shown in FIGS. 4-6. A write head portion (not shown) is further formed if necessary. The wafer on which a plurality of these structures have been formed is cut, and air bearing surface ABS is formed by mechanical processing. In this way, initial bias layers 64 are processed into bias layers 6 such that the height equals MRH, and portions of initial lead layers 71 are processed into lead layers 7.

Bias layers 6 in thin-film magnetic head 1 which is configured in this way and which has been produced by this method have a long and narrow shape and can, by the effect of shape anisotropy, exert a uniform bias magnetic field upon MR sensor 2. In addition, lead layers 7 are formed by the steps which are independent of forming steps of bias layers 6 so as to have sufficient cross-sectional area to prevent increase in electrical resistance, resulting in a sufficient flow of sense current 22 and an increase in read sensitivity.

Figure 1:
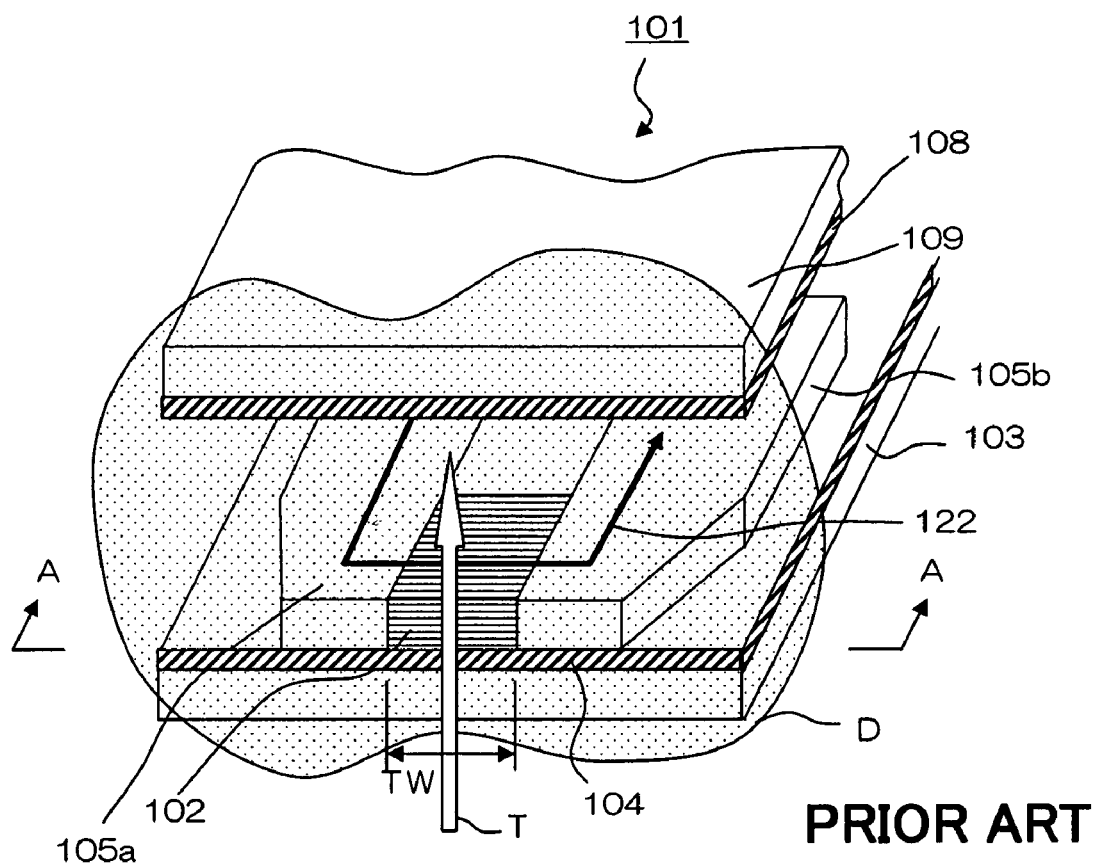
FIG. 1 is a perspective sectional view showing an example of a thin-film magnetic head of the prior art.
Figure 2:
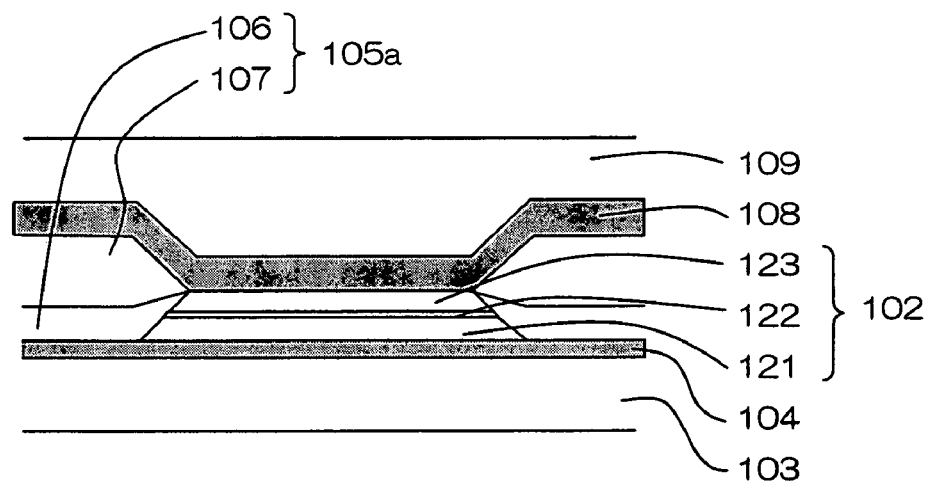
FIG. 2 is a sectional view showing an example of a thin-film magnetic head of the prior art.
Figure 3A:
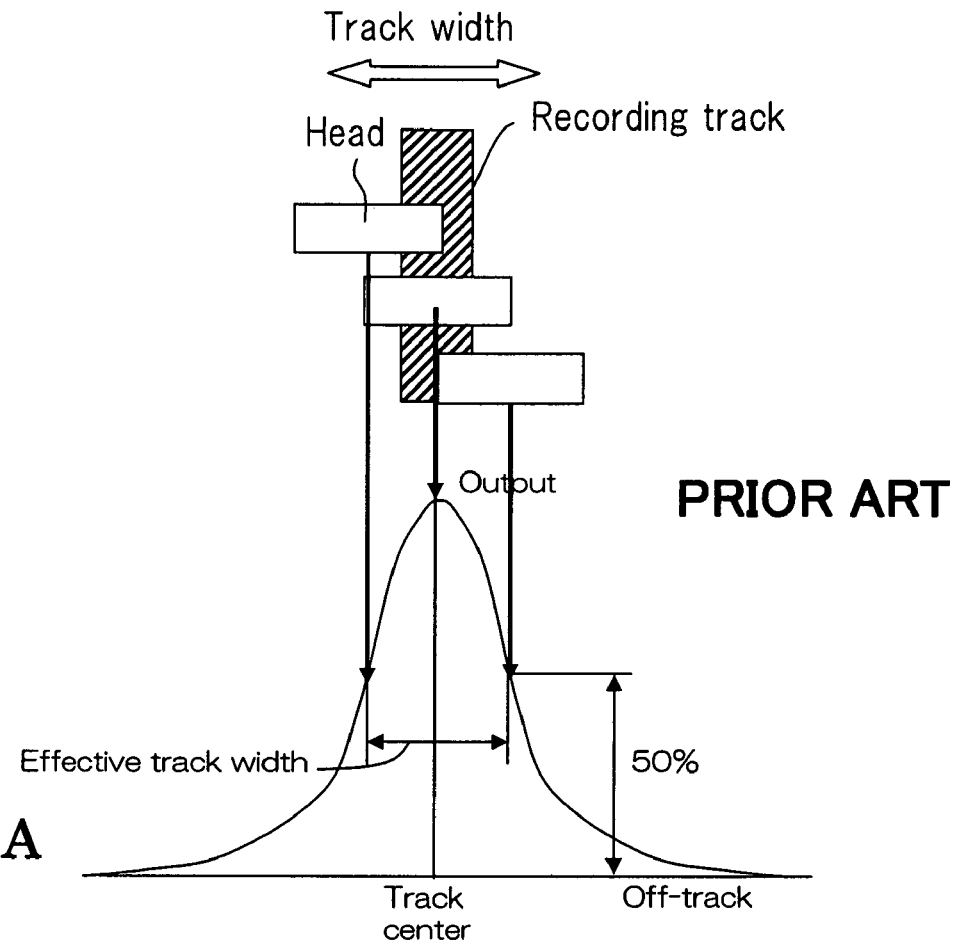
FIGS. 3A and 3B are graphs showing the characteristics of an example of a thin-film magnetic head of the prior art.
Figure 3B:
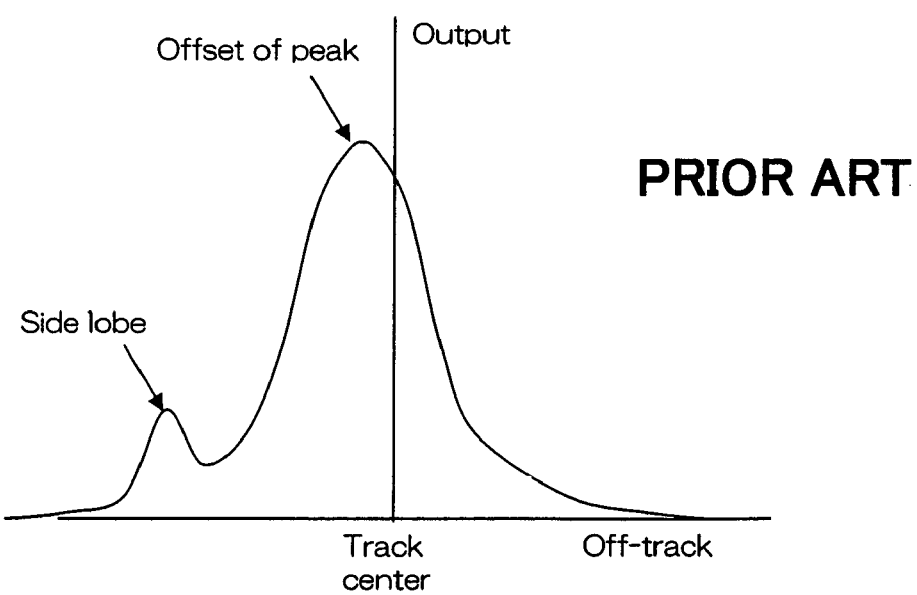

Next, the performance of the thin-film magnetic head of the present invention was confirmed using test samples. One hundred thin-film magnetic heads were produced as comparative examples according to the process and configuration described in the related art. In these magnetic heads, the bias layers were formed from air bearing surface ABS to deep positions as shown in FIG. 1. The specific layer configuration is shown in Table 1. Next, One hundred thin-film magnetic heads were produced as an embodiment by the processes of the present invention. These magnetic heads have long and narrow bias layers as shown in FIGS. 4B and 6. The specific layer configuration is shown in Table 2. The layer configurations are basically identical in both cases, but differ in which protective layers were formed on the lead layers in the comparative examples. In both cases, the track width TW was 0.1 μm, MRH was 0.1 μm, and width BW of the bias layers in the track width direction in the embodiment was 1 μm. For reference, the notation A/B/C in the table indicates stacking in the order of layer A, layer B, and layer C starting from the lowermost layer, and the numerical value to the right of the compositional formula indicates the layer thickness.

TABLE 1

| 9 | upper magnetic shield | NiFe 2 μm |
|---|---|---|
| 8 | upper insulating layer | Al$_2$O$_3$ 20 nm |
| 7 | lead layer/protective layer | Ta 10 nm/AuCu 60 nm/Ta 10 nm/Al$_2$O$_3$ 30 nm |
| 6 | soft magnetic layer/antiferromagnetic layer | NiFe 25 nm/IrMn 6 nm |
| 5 | upper ferromagnetic layer | CoFe 1 nm/NiFe 3 nm/Ta 2 nm |
| 4 | non-magnetic layer | Cu 1.8 nm |
| 3 | lower ferromagnetic layer | NiCr 5 nm/PtMn 15 nm/CoFe 1.5 nm/Ru 0.8 nm/CoFe 1.6 nm |
| 2 | lower insulating layer | Al$_2$O$_3$ 20 nm |
| 1 | lower magnetic shield | NiFe 2 μm |

TABLE 2

| 9 | upper magnetic shield | NiFe 2 μm |
|---|---|---|
| 8 | upper insulating layer | Al$_2$O$_3$ 20 nm |
| 7 | lead layer | Ta 10 nm/AuCu 60 nm/Ta 10 nm |
| 6 | soft magnetic layer/antiferromagnetic layer | NiFe 25 nm/IrMn 6 nm/Ta 2 nm |
| 5 | upper ferromagnetic layer | CoFe 1 nm/NiFe 3 nm/Ta 2 nm |
| 4 | non-magnetic layer | Cu 1.8 nm |
| 3 | lower ferromagnetic layer | NiCr 5 nm/PtMn 15 nm/CoFe 1.5 nm/Ru 0.8 nm/CoFe 1.6 nm |
| 2 | lower insulating layer | Al$_2$O$_3$ 20 nm |
| 1 | lower magnetic shield | NiFe 2 μm |

Figure 11A:
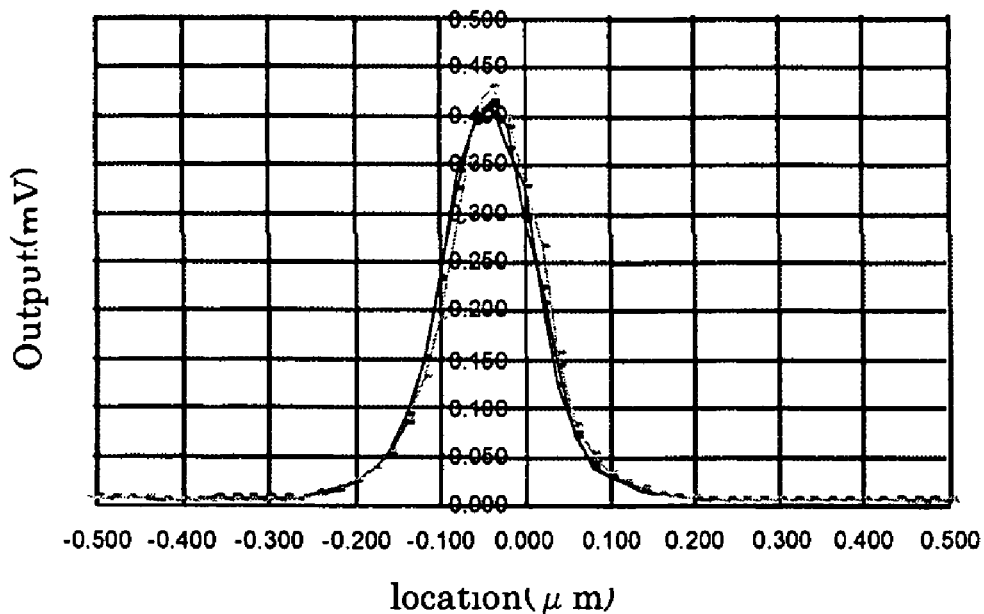
FIGS. 11A and 11B are exemplary charts showing side lobes characteristics of thin-film magnetic heads which have been produced by the process of the prior art and the process of the present invention.
Figure 11B:
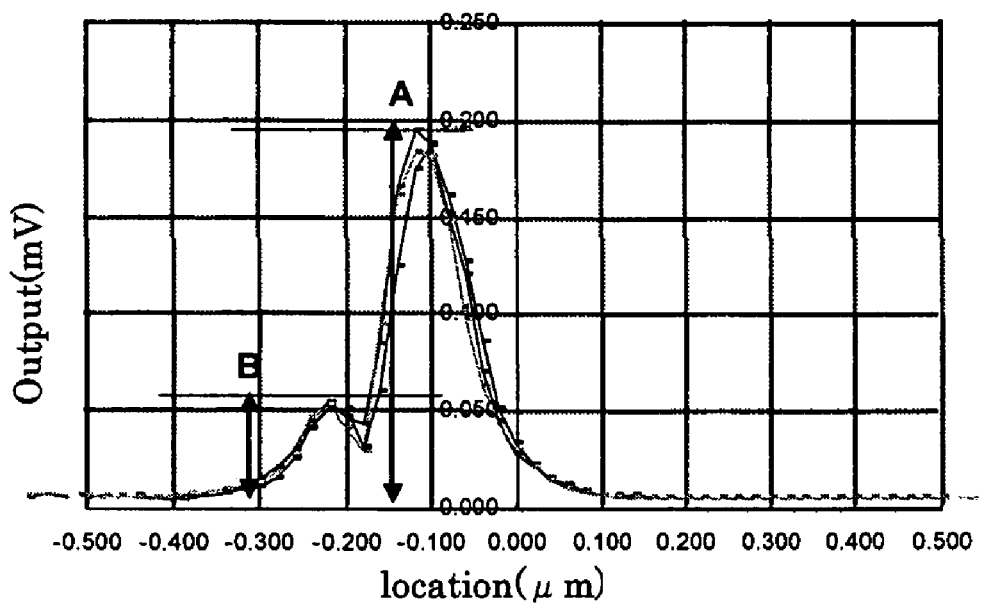

The rate of occurrence of side lobes was 75% in the comparative examples shown in Table 1, and 4% in the embodiment shown in Table 2. FIGS. 11A and 11B show typical side lobe characteristics of the thin-film magnetic heads which were produced by the process of the present invention and the process of the prior art, respectively. From these characteristics, it was confirmed that the thin-film magnetic head of the present invention can effectively suppress the occurrence of side lobes. Side lobes were defined to be an output B which exceeds at least 10% of output A of the peak signal in FIG. 11B.

Figure 12:
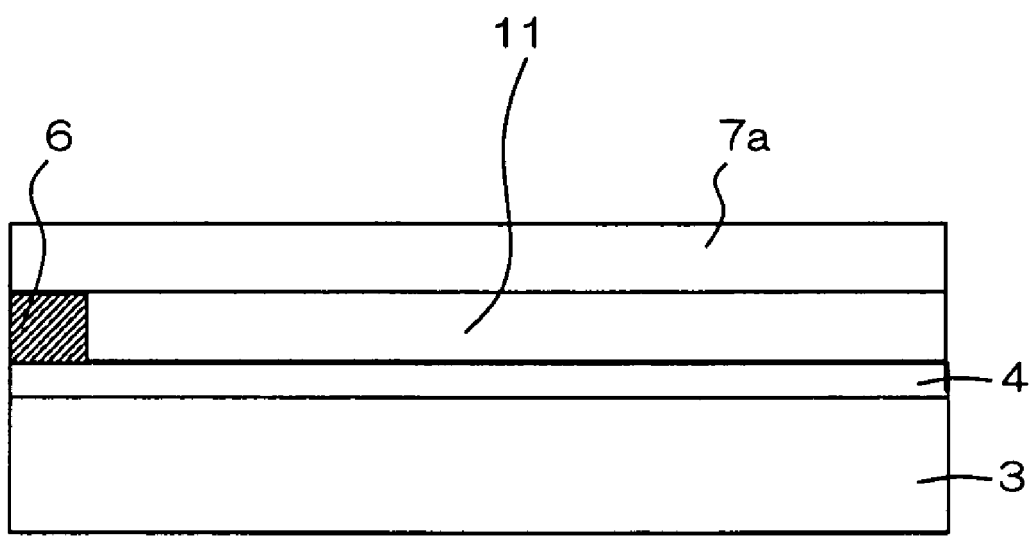
FIG. 12 is a sectional view of a thin-film magnetic head according to the second embodiment of the present invention.

FIG. 12 shows a sectional view of the thin-film magnetic head according to the second embodiment of the present invention. In this embodiment, the spaces behind rear surfaces of bias layers 6 are embedded by insulating layer 11 of, for example, alumina, and lead layers 7a are stacked over these layers. Insulating layer 11 is formed behind initial bias layer 64 after original bias layer 63 has been milled to form initial bias layer 64 through liftoff method such that insulating layers 11 contact initial bias layers 64. This configuration allows the formation of a flatter upper shield layer 9 and more stable element characteristics.

Figure 13:
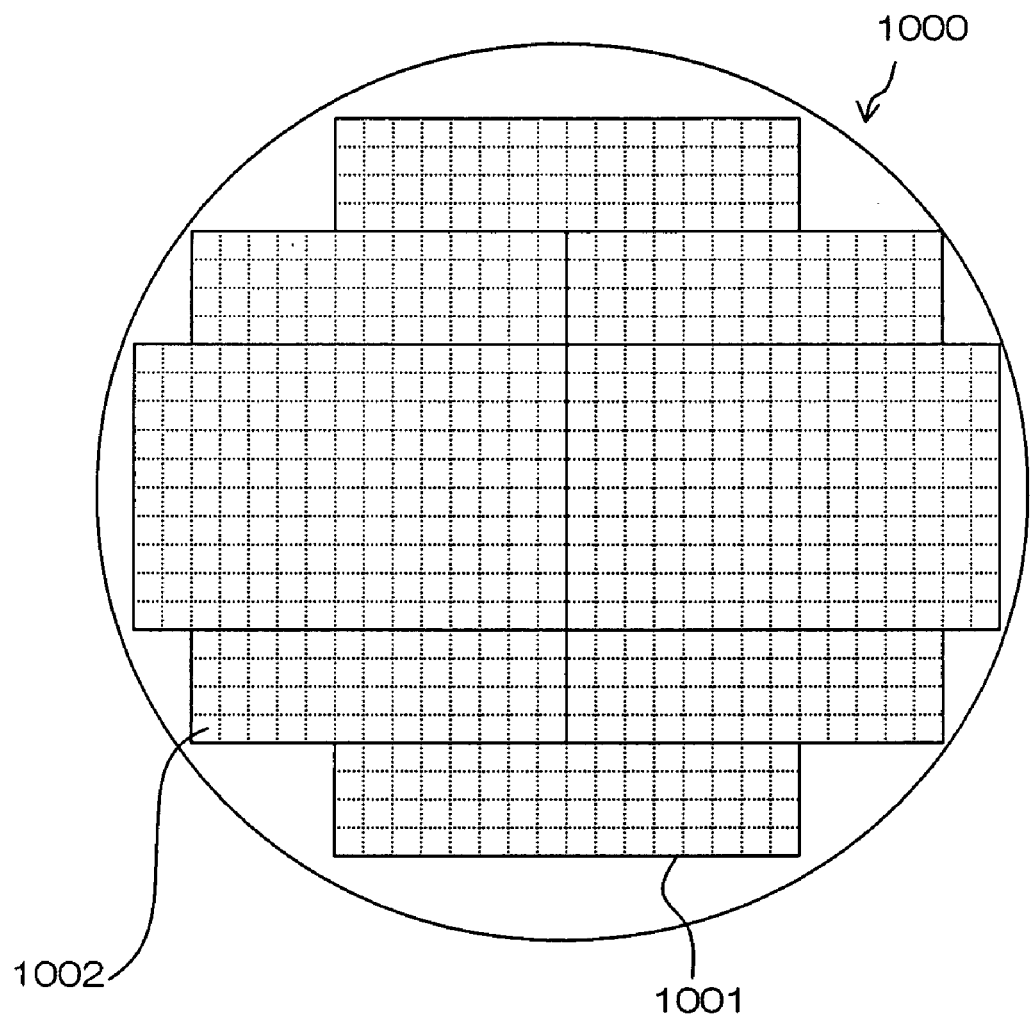
FIG. 13 is a plan view of a wafer associated with manufacturing of a thin-film magnetic head according to the present invention.

Next, explanation regards a wafer for fabricating the above-described thin-film magnetic head. FIG. 13 is a schematic plan view of the wafer. Wafer 1000 is partitioned into a plurality of thin-film magneto-electric transducer assemblies 1001. Each thin-film magneto-electric transducer assembly 1001 includes thin-film magneto-electric transducers 1002, in each of which at least layers 3-9 are stacked, and serves as a work unit in the polishing process of the ABS. Cut margins (not shown) are provided for cutting between thin-film magneto-electric transducer assemblies 1001 and between thin-film magneto-electric transducers 1002.

Figure 14:
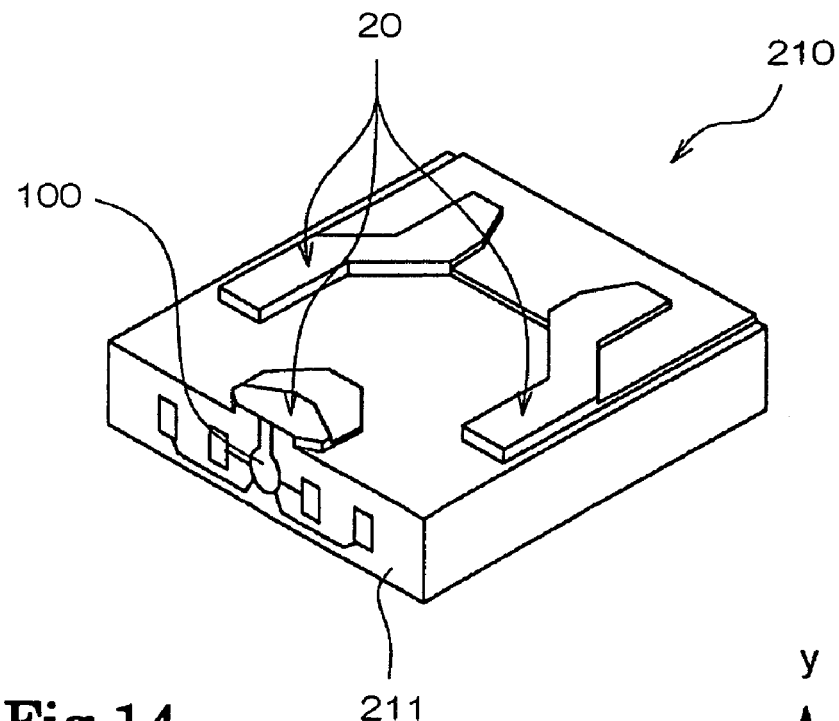
FIG. 14 is a perspective view illustrating a slider included in a head gimbal assembly which incorporates a thin-film magnetic head according to the present invention.

Explanation next regards a head gimbal assembly and a hard disk device having thin-film magnetic head 1. Referring to FIG. 14, explanation is first presented regarding slider 210 included in the head gimbal assembly. In the hard disk device, slider 210 is arranged opposite to a hard disk, which is a rotarily-driven disciform storage medium. Slider 210 is provided with body 211 mainly formed of substrate and overcoat layer (not shown). Body 211 has a substantially hexahedral form. One surface of the six surfaces of body 211 is positioned opposite to the hard disk, with air bearing surface 20 being formed on the surface. When the hard disk rotates moving in the z direction in FIG. 14, the airflow which passes between the hard disk and slider 210 creates a dynamic lift, which is applied to slider 210 downward in the y direction of FIG. 14. Slider 210 is lifted away from the surface of the hard disk by this dynamic lift. For reference, the x direction in FIG. 14 is the transverse direction of the track of the hard disk. In the proximity to the trailing edge of slider 210 on the outlet side of the airflow (the end portion at the lower left in FIG. 14), thin-film magnetic head 100 is formed.

Figure 15:
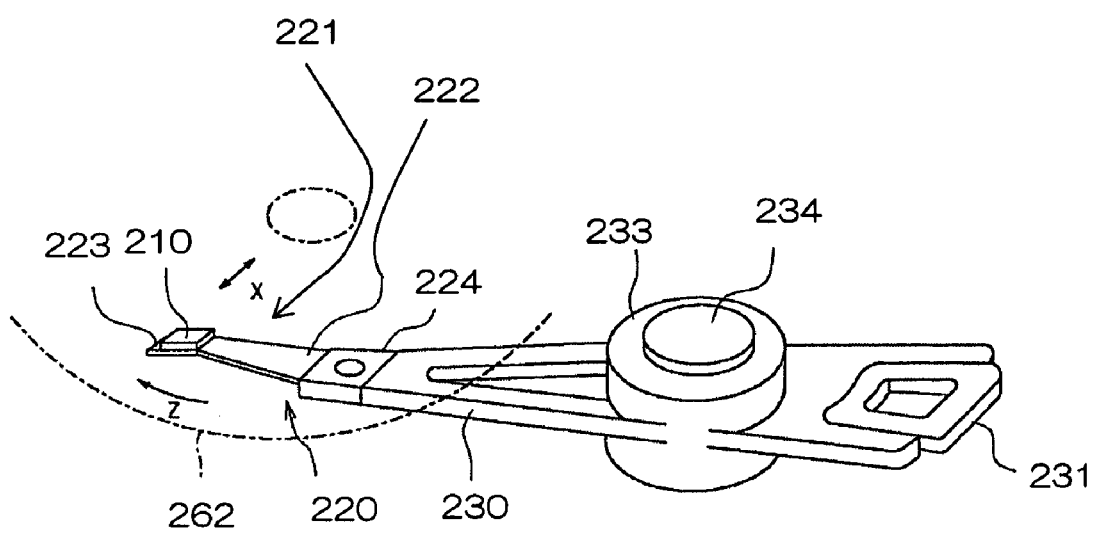
FIG. 15 is a perspective view illustrating a head arm assembly including the head gimbal assembly which incorporates a thin-film magnetic head according to the present invention.

Referring to FIG. 15, explanation is next presented regarding head gimbal assembly having thin-film magnetic head 1. Head gimbal assembly 220 is provided with slider 210 and suspension 221 for resiliently supporting slider 210. Suspension 221 has; load beam 222 in a shape of flat spring and made of, for example, stainless steel; flexure 223 attached to one end of load beam 222, and to which slider 210 is fixed, while providing appropriate degree of freedom to slider 210; and base plate 224 provided in the other end of load beam 222. Base plate 224 is adapted to be attached to arm 230 of the actuator for moving slider 210 in the transverse direction of the track of the hard disk 262. The actuator is provided with arm 230 and a voice coil motor for driving arm 230. The portion of the flexure to which slider 210 is provided with a gimbal section for maintaining a constant posture of slider 210.

Head gimbal assembly 220 is attached to arm 230 of the actuator. The arrangement having a head gimbal assembly attached to a single arm is called a head arm assembly.

The arrangement having head gimbal assemblies attached to respective arms of a carriage having a plurality of arms is called a head stack assembly. FIG. 15 illustrates an example of a head arm assembly, in which head gimbal assembly 220 is attached to one end of arm 230. To the other end of arm 230, there is attached coil 231, which makes a part of a voice coil motor. In the intermediate portion of arm 230, bearing section 233 is provided to fit on shaft 234 for rotatably holding arm 230.

Figure 16:
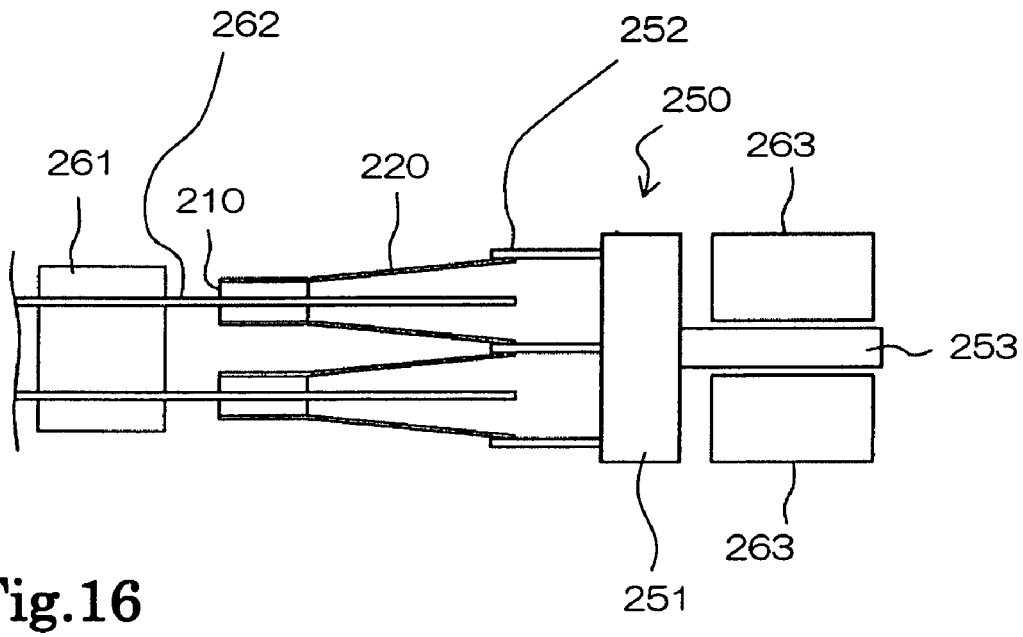
FIG. 16 is an explanatory diagram illustrating an essential part of a hard disk device which incorporates a thin-film magnetic head according to the present invention.
Figure 17:
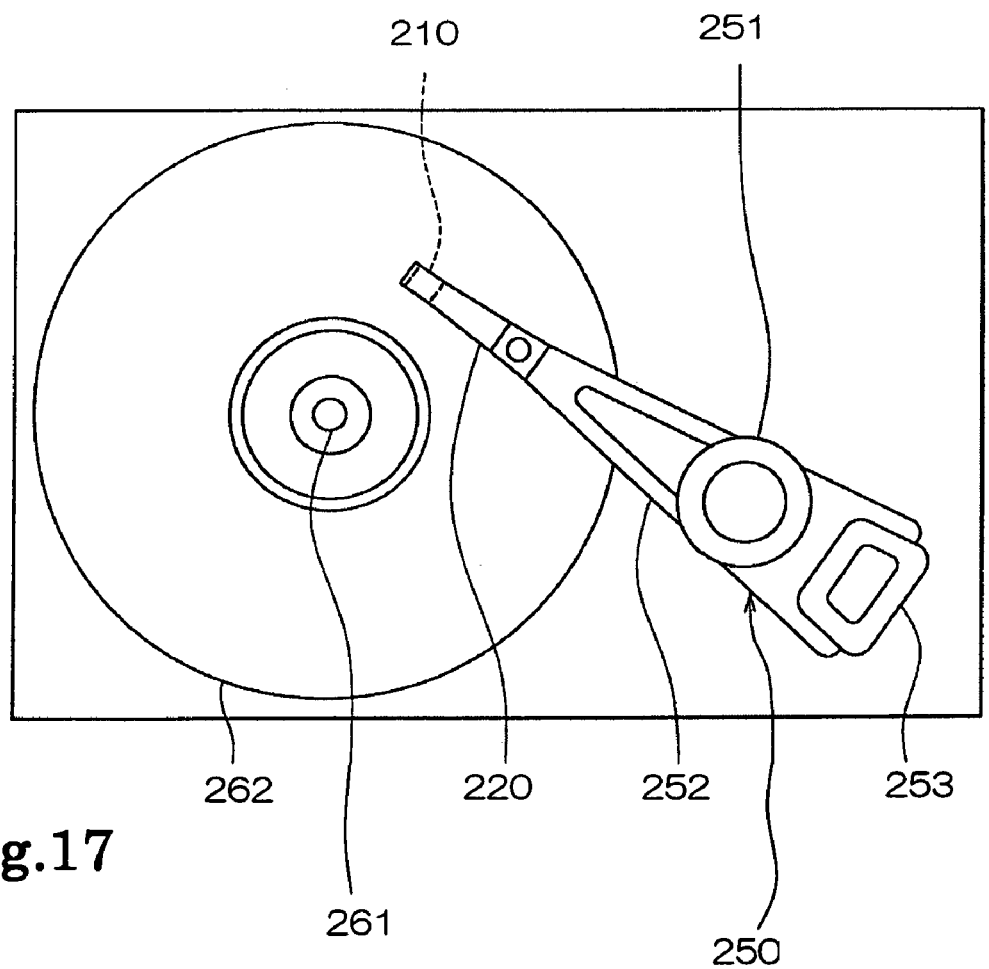
FIG. 17 is a plan view of a hard disk device which incorporates a thin-film magnetic head according to the present invention.

Referring to FIG. 16 and FIG. 17, explanation is next presented regarding the head stack assembly and the hard disk device employing thin-film magnetic head 1. FIG. 17 is an explanatory diagram illustrating an essential part of the hard disk device, and FIG. 9 is a plan view of the hard disk device. Head stack assembly 250 has carriage 251 provided with a plurality of arms 252. A plurality of head gimbal assemblies 220 are attached to a plurality of arms 252. Head gimbal assemblies 220 is aligned spaced apart from each other in the vertical direction. Coil 253, which is a part of the voice coil, is attached to carriage 251 at the opposite side to arms 252. Head stack assembly 250 is installed in the hard disk device, which has a plurality of hard disks connected to spindle motor 261. Two sliders for each hard disk 262 are arranged in opposed positions interposing hard disk 262. The voice coil motor has permanent magnets 263 arranged in opposed positions interposing coil 253 of head stack assembly 250.

Head stack assembly 250 and the actuator, except for sliders 210, work as a locating device, carrying the sliders 210 and operating to locate sliders 210 relative to hard disks 262.

The hard disk device moves sliders 210 in the transverse directions of the tracks of hard disks 262 by the actuator, and locates sliders 210 relative to hard disks 262. The thin-film magnetic head 1 contained in slider 210 records information to hard disk 262, and also reads information recorded in hard disk 262.

While preferred embodiments of the present invention have been described using specific terms, such description is for illustrative purposes only, and it is to be understood which changes and variations may be made without departing from the spirit or scope of the following claims.

What is claimed is:

1. A thin-film magnetic head, comprising:
  a lower insulating layer;
  a magnetoresistive (MR) sensor formed on said lower insulating layer and comprising;
    a first ferromagnetic layer in which a magnetization direction is fixed with respect to external magnetic fields,
    a non-magnetic intermediate layer, and
    a second ferromagnetic layer in which a magnetization direction, changes with respect to the external magnetic fields;
  a pair of bias layers for exerting a bias magnetic field upon the MR sensor said bias layers extending substantially symmetrically from two sides of said MR sensor in a direction of track width of a recording medium, each bias layer being connected with said MR sensor over a length which is substantially the same as said MR sensor in a direction perpendicular to the air bearing surface, and each bias layer having a shape which is contained within an imaginary rectangle which has its long sides along said air bearing surface in the direction of the track width of the recording medium and its short sides in the direction perpendicular to said air bearing surface and which contacts the short side of the imaginary rectangle which is opposite the short side which contacts said MR sensor;
  a pair of lead layers for supplying said sense current to said MR sensor each extending from said air bearing surface to cover at least a portion of each of said bias layers; and
  an insulating layer formed on said lower insulating layer and contacting said pair of bias layers only on a side of said bias layers which is opposite the air bearing surface, an upper surface of the insulating layer being flush with an upper surface of the bias layers,
  wherein said pair of lead layers covers at least a portion of said pair of bias layers and said insulating layer, and
  wherein each of said bias layers has a shape which is contained within said imaginary rectangle in which a ratio of a length of said long sides to a length of said short sides is at least 5.

2. A thin-film magnetic head, comprising:
  a lower insulating layer;
  a magnetoresistive (MR) sensor formed on said lower insulating layer and comprising:
    a first ferromagnetic layer in which a magnetization direction is fixed with respect to external magnetic fields,
    a non-magnetic intermediate layer, and
    a second ferromagnetic layer in which a magnetization direction changes with respect to the external magnetic fields;
  a pair of bias layers for exerting a bias magnetic field upon the MR sensor, said bias layers extending substantially symmetrically from two sides of said MR sensor in a direction of track width of a recording medium, each bias layer being connected with said MR sensor over a length which is substantially the same as said MR sensor in a direction perpendicular to the air bearing surface, and each bias layer having a shape which is contained within an imaginary rectangle which has its long sides along said air bearing surface in the direction of the track width of the recording medium and its short sides in the direction perpendicular to said air bearing surface and which contacts the short side of the imaginary rectangle which is opposite the short side which contacts said MR sensor;
  a pair of lead layers for supplying said sense current to said MR sensor each extending from said air bearing surface to cover at least a portion of each of said bias layers; and
  an insulating layer formed on said lower insulating layer and contacting said pair of bias layers only on a side of said bias layers which is opposite the air bearing surface, an upper surface of the insulating layer being flush with an upper surface of the bias layers,
  wherein said pair of lead layers covers at least a portion of said pair of bias layers and said insulating layer,
  wherein said bias layers each includes a stack structure having a soft magnetic layer and an antiferromagnetic, and
  wherein each of said bias layers has a shape which is contained within said imaginary rectangle in which a ratio of a length of said long sides to a length of said short sides is at least 5.

3. A method for fabricating a thin-film magnetic head, comprising:

forming a lower insulating layer on a wafer;

forming on said lower insulating layer at least one center layer which includes in a portion a magnetoresistive (MR) sensor comprising a first ferromagnetic layer in which a magnetization direction is fixed with respect to external magnetic fields, a non-magnetic intermediate layer, and a second ferromagnetic layer in which a magnetization direction changes with respect to the external magnetic fields;

forming a pair of initial bias layers on both sides of said center layer, wherein each of the initial bias layers includes in a portion a bias layer for exerting a bias magnetic field upon said MR sensor;

forming a pair of initial lead layers on both sides of said center layer, wherein each of said initial lead layers extends to cover at least a portion of each of said initial bias layers and contains a lead layer for supplying said sense current to said MR sensor;

processing said wafer, said center layer, said initial bias layers, and said initial lead layers and forming said MR sensor by exposing an air bearing surface such that:

said pair of bias layers are formed such that:

said bias layers extend substantially symmetrically from two sides of said MR sensor in a direction of track width of a recording medium;

said bias layers are each connected with said MR sensor over a length which is substantially equal to a length of said MR sensor in a direction perpendicular to said air bearing surface, and said bias layers each have a shape which is contained within an imaginary rectangle which has long sides along said air bearing surface in the direction of track width of said recording medium and short sides in the direction perpendicular to said air bearing surface, wherein each bias layer contacts the short side of said imaginary rectangle which is opposite the short side which contacts said MR sensor, and said pair of lead layers are formed such tat each of said lead layers extends from the air bearing surface to cover at least a portion of each of said bias layers; and forming an insulating layer on said lower insulating layer, said insulating layer contacting said pair of bias layers only on a side of said bias layers which is opposite the air bearing surface, and an upper surface of the insulating layer being flush with an upper surface of the bias layers, wherein said pair of lead layers covers at least a portion of said pair of bias layers and said insulating layer, and wherein said forming said bias layers includes forming said bias layers such that each of said bias layers have a shape which is contained within said imaginary rectangle in which a ratio of a length of said long sides to a length of said short sides is at least 5.

4. A method for fabricating a thin-film magnetic head, comprising:

forming a lower insulating layer on a wafer;

forming on said lower insulating layer at least one center layer which includes in a portion a magnetoresistive (MR) sensor comprising a first ferromagnetic layer in which a magnetization direction is fixed with respect to external magnetic fields, a non-magnetic intermediate layer, and a second ferromagnetic layer in which a magnetization direction changes with respect to the external magnetic fields;

forming a pair of initial bias layers on both sides of said center layer, wherein each of the initial bias layers includes in a portion a bias layer for exerting a bias magnetic field upon said MR sensor;

forming a pair of initial lead layers on both sides of said center layer, wherein each of said initial lead layers extends to cover at least a portion of each of said initial bias layers and contains a lead layer for supplying said sense current to said MR sensor;

processing said wafer, said center layer, said initial bias layers, and said initial lead layers and forming said MR sensor by exposing an air bearing surface such that:

said pair of bias layers are formed such that:

said bias layers extend substantially symmetrically from two sides of said MR sensor in a direction of track width of a recording medium;

said bias layers are each connected with said MR sensor over a length which is substantially equal to a length of said MR sensor in a direction perpendicular to said air bearing surface, and said bias layers each have a shape which is contained within an imaginary rectangle which has long sides along said air bearing surface in the direction of track width of said recording medium and short sides in the direction perpendicular to said air bearing surface, wherein each bias layer contacts the short side of said imaginary rectangle which is opposite the short side which contacts said MR sensor, and said pair of lead layers are formed such that each of said lead layers extends from the air bearing surface to cover at least a portion of each of said bias layers; and forming an insulating layer on said lower insulating layer, said insulating layer contacting said pair of bias layers only on a side of said bias layers which is opposite the air bearing surface, and an upper surface of the insulating layer being flush with an upper surface of the bias layers, wherein said pair of lead layers covers at least a portion of said pair of bias layers and said insulating layer, wherein said forming said initial bias layers includes forming a stacked structure which includes a soft magnetic layer and an antiferromagnetic layer, and wherein said forming said bias layers includes forming said bias layers such that said bias layers have a shape which is contained within said imaginary rectangle in which a ratio of a length of said long sides to a length of said short sides is at least 5.

* * * * *